(12) United States Patent
Chakravarty (10) Patent No.: US 9,256,505 B2
(45) Date of Patent: Feb. 9, 2016

(54) DATA TRANSFORMATIONS TO IMPROVE ROM YIELD AND PROGRAMMING TIME

(71) Applicant: LSI Corporation, San Jose, CA (US)

(72) Inventor: Sreejit Chakravarty, Mountain View, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 183 days.

(21) Appl. No.: 14/215,228

(22) Filed: Mar. 17, 2014

(65) Prior Publication Data

US 2015/0261636 A1    Sep. 17, 2015

(51) Int. Cl.
| G06F 11/00 | (2006.01) |
| G06F 11/27 | (2006.01) |
| G06F 11/07 | (2006.01) |

(52) U.S. Cl.
CPC ............. *G06F 11/27* (2013.01); *G06F 11/073* (2013.01)

(58) Field of Classification Search
CPC ..................................................... G06F 11/27
USPC ................................ 714/30, 32, 33, 733, 734
See application file for complete search history.

(56) References Cited

U.S. PATENT DOCUMENTS

| 5,764,655 | A | * | 6/1998 | Kirihata | ............. G06F 11/2635 714/733 |
| 5,883,843 | A | | 3/1999 | Hii et al. | |
| 6,151,692 | A | * | 11/2000 | Smitlener | ............. G11C 29/56 365/201 |
| 6,230,290 | B1 | * | 5/2001 | Heidel | ................. G11C 29/16 714/718 |
| 6,801,461 | B2 | | 10/2004 | Hii et al. | |
| 7,328,388 | B2 | | 2/2008 | Hii et al. | |
| 7,475,314 | B2 | | 1/2009 | Chhabra et al. | |
| 7,631,236 | B2 | | 12/2009 | Gorman et al. | |
| 8,589,750 | B2 | | 11/2013 | Banerjee et al. | |
| 2012/0331309 | A1 | | 12/2012 | Scott et al. | |

FOREIGN PATENT DOCUMENTS

| EP | 1 083 682 A2 | 3/2001 |
| EP | 1 083 682 A3 | 7/2003 |
| EP | 1 473 836 A1 | 11/2004 |

* cited by examiner

*Primary Examiner* — Dieu-Minh Le
(74) *Attorney, Agent, or Firm* — Suiter Swantz pc llo (57) ABSTRACT

Methods and systems for generating data transformations to improve ROM yield and programming time. A bit flip register can be configured in association with the ROM and a binary string can be read into the bit flip register on reset. Subsequently, data output from the ROM can be selectively complemented utilizing a content of the bit flip register and the content of the bit flip register can be programmed into the ROM in order to reduce programming time for each ROM. A defective cell can be tolerated by selectively flipping a column with respect to the defective cell to improve yield. A built-in self-test (BIST) engine that generates addresses up to and including content of an address limiting register can be employed to limit the ROM access to a programmed part during testing in order to tolerate defects in any unused location.

20 Claims, 12 Drawing Sheets

| B5 | B4 | B3 | B2 | B1 | B0 |
|----|----|----|----|----|----|
| 0  | 1  | 0  | 1  | 0  | 0  |
| 0  | 0  | 0  | 1  | 0  | 1  |
| 1  | 0  | 1  | 1  | 0  | 0  |
| 0  | 0  | 0  | 0  | 1  | 0  |
| 0  | 0  | 1  | 0  | 0  | 1  |
| 1  | 0  | 0  | 1  | 0  | 1  |
| 0  | 1  | 0  | 1  | 0  | 1  |
| 0  | 0  | 0  | 1  | 0  | 1  |

FIG. 1

| B5 | B4 | B3 | B2 | B1 | B0 |
|----|----|----|----|----|----|
| 0  | 1  | 0  | 1  | 0  | 0  |
| 0  | 0  | 0  | 1  | 0  | 1  |
| 1  | 0  | 1  | 1  | 0  | 0  |
| 0  | 0  | 0  | 0  | 1  | 0  |
| 0  | 0  | 1  | 0  | 0  | 1  |
| 1  | 0  | 0  | 1  | 0  | 1  |
| 0  | 1  | 0  | 1  | 0  | 1  |
| 0  | 0  | 0  | 1  | 0  | 1  |
| 0  | 0  | 0  | 0  | 0  | 0  |
| 0  | 0  | 0  | 0  | 0  | 0  |
| 0  | 0  | 0  | 0  | 0  | 0  |
| 0  | 0  | 0  | 0  | 0  | 0  |
| 0  | 0  | 0  | 0  | 0  | 0  |
| 0  | 0  | 0  | 0  | 0  | 0  |
| 0  | 0  | 0  | 0  | 0  | 0  |
| 0  | 0  | 0  | 0  | 0  | 0  |

|  | B5 | B4 | B3 | B2 | B1 | B0 |
|---|---|---|---|---|---|---|
| BIT_FLIP | 0 | 0 | 0 | 1 | 0 | 1 |
| ADDR_LIM | 0 | 0 | 1 | 1 | 0 | 0 |
|  | 0 | 1 | 0 | 0 | 0 | 1 |
|  | 0 | 0 | 0 | 0 | 0 | 0 |
|  | 1 | 0 | 1 | 0 | 0 | 1 |
|  | 0 | 0 | 0 | 1 | 1 | 1 |
|  | 0 | 0 | 1 | 1 | 0 | 0 |
|  | 1 | 1 | 0 | 0 | 0 | 0 |
|  | 0 | 1 | 0 | 0 | 0 | 0 |
| GOLD_SIG | 0 | 1 | 0 | 0 | 0 | 1 |
|  | 0 | 0 | 0 | 0 | 0 | 0 |
|  | 0 | 0 | 0 | 0 | 0 | 0 |
|  | 0 | 0 | 0 | 0 | 0 | 0 |
|  | 0 | 0 | 0 | 0 | 0 | 0 |
|  | 0 | 0 | 0 | 0 | 0 | 0 |
|  | 0 | 0 | 0 | 0 | 0 | 0 |
|  | 0 | 0 | 0 | 0 | 0 | 0 |

DATA TRANSFORMATIONS TO IMPROVE ROM YIELD AND PROGRAMMING TIME

FIELD OF THE INVENTION

Embodiments are generally related to electronic devices and circuits. Embodiments are additionally related to ROM (Read-Only Memory). Embodiments are also related to the reduction of ROM programming time and improvement in ROM yield.

BACKGROUND

ROM is a storage medium class used in computers and other electronic devices. Data stored in ROM cannot be modified or may be modified only slowly or with difficulty, so it is often employed in the distribution of firmware. Strictly, ROM refers to memory that is hard-wired such as diode matrix and the later mask ROM. Although discrete circuits can be altered (in principle), ICs cannot and are useless if the data are bad. Despite the simplicity, speed and economies of scale of mask ROM, field-programmability often make reprogrammable memories more flexible and inexpensive.

Figure 1:
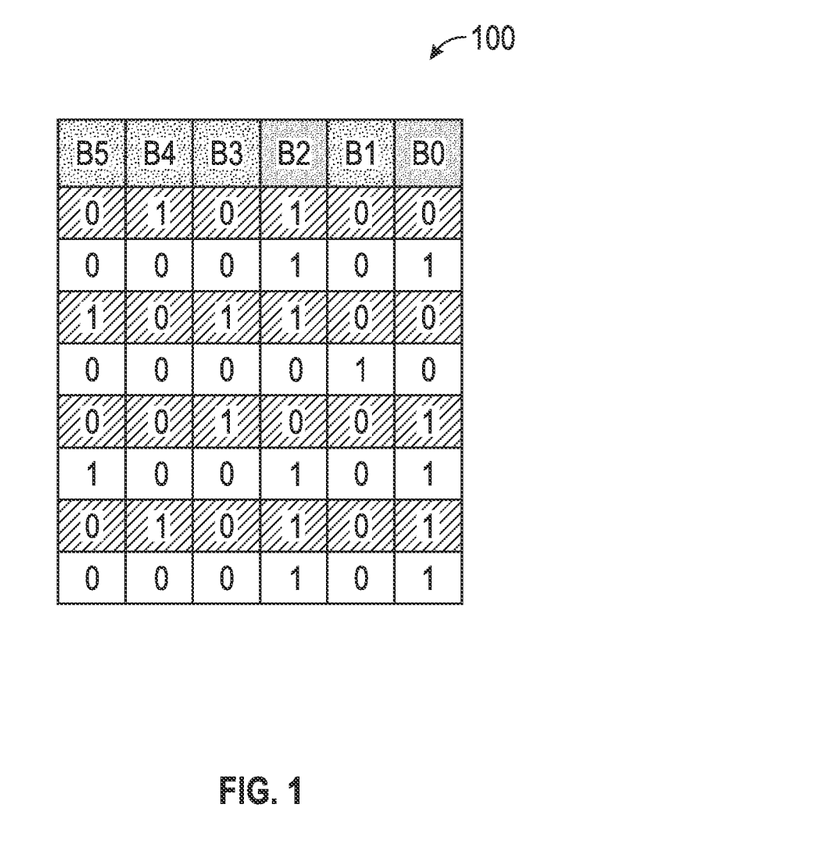
FIG. 1 illustrates block diagram of an example 8*6 bit ROM image.

The majority of prior art ROM programming techniques increase ROM programming time and decrease ROM yield. For example, consider the case of 8×6 bit eFuse with all bits set to 0 initially. An image consisting of 1/0 s may be programmed into the eFuse. The image to be burnt varies from die to die. An example image to be burnt into the eFuse is shown in the block diagram 100 depicted in FIG. 1. During eFuse programming, one bit at a time is programmed. Programming includes a number of steps such as, for example, addressing a bit location to be programmed to 1, one bit at a time. A long high voltage pulse can be applied at a special pin (VDDQ). For TSMC 45 nm eFuses, the pulse width is 12 us; this pulse width may increase from, for example, 10 us in 65 nm to 12 us in 45 nm. For the example shown in FIG. 1, 18 1 s have to be programmed. Programming time will be approximately 12*18 us=216 us. The larger the number of bits to be programmed, the larger the programming time. Increasing the number of programming cycles adversely affects the eFuse reliability.

Figure 2:
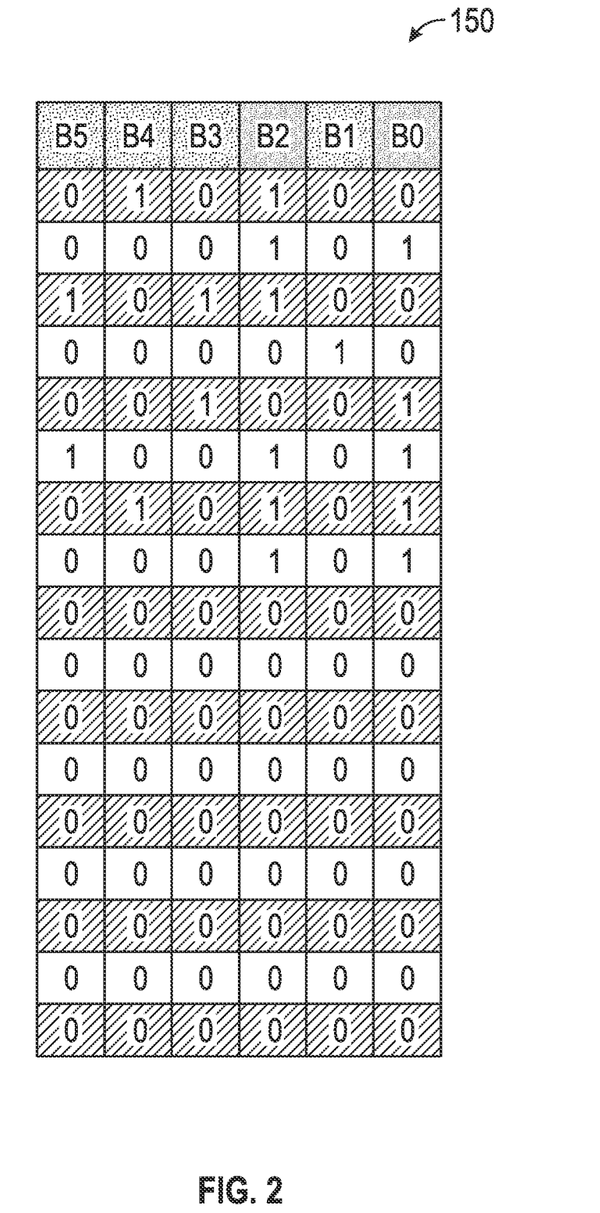
FIG. 2 illustrates a block diagram of an example 16*6 bit ROM image.

Furthermore, a fault-free ROM, prior to programming, may have all bits to be 0 (or 1, depending on the technology). Next, for each bit location that needs to be set to 1, it is programmed to 1 by blowing the fuse. However, due to a defect, some bits may be set to 1 and it cannot have that bit be set to 0. For example, consider the example 16×6 bit ROM shown in diagram 150 in FIG. 2. Initially, all bits in the ROM are set to 0 and only 8 of the 16 words are utilized. Therefore, if a defect is present in any of the bits in location 9 through 16, those defects are "harmless" so far as the native mode usage of this instance of the ROM is concerned. Prior art approaches however, discard such ROM to tolerate the defects thereby reducing ROM yield.

Based on the foregoing, it is believed that a need exists for improved methods and systems for enhancing ROM yield and programming time utilizing data transformation, as described in greater detail herein.

SUMMARY

The following summary is provided to facilitate an understanding of some of the innovative features unique to the disclosed embodiment and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved electronic devices and circuits.

It is another aspect of the disclosed embodiments to provide for it improved ROM programming methods and systems.

It is further aspect of the disclosed embodiment to provide improved methods and systems for enhancing ROM yield and programming time utilizing data transformation.

The aforementioned aspects and other objectives and advantages can now be achieved as described herein. Methods and systems are disclosed for enhancing ROM yield and programming time utilizing data transformation. A bit flip register can be configured in association with the ROM and a binary string can be read into the bit flip register on reset. Subsequently, data exiting the ROM (e.g.; DATA_INT) can be selectively complemented utilizing a content of the bit flip register and the content of the bit flip register can be programmed into the ROM in order to reduce programming time for each ROM. A defective cell can be tolerated by selectively flipping a column with respect to the defective cell to improve yield. A built-in self-test (BIST) engine that generates addresses up to and including content of an address limiting register can be employed to limit the ROM access to a programmed part during test in order to tolerate defect in any unused location. An image header can be modified by adding a base address field that includes a start address of the rest of the header and the ROM image. Such an approach simultaneously reduces ROM programming time and increases ROM yield.

The bits can be flipped to cover the defects in the ROM and then the remaining selective bits can be flipped to reduce the programming time. If a column has been flipped to tolerate the defect, then it cannot be flipped to reduce test time. In a functional mode, only the programmed part of the ROM can be accessed and the ROM access can be limited to the programmed part during test. The address generator with respect to the ROM BIST engine generates addresses up to and including the content of the address limiting register. The output of the ROM can be compressed into a Multiple-input Signature Register (MISR).

A signature stored in the MISR can be compared with a gold signature which is stored in the last utilized location of the ROM at the end of the run. By limiting the access of the ROM only within a region where it has been programmed, the ROM BIST engine does not access the defective cells and the test can pass in order to improve the ROM yield and can tolerate any defect in any of the unused location. RESET_FSM clears a REL address register and loads the base address bits and the bit flip register bits, respectively, into the base address register and the bit flip register. The REL address register and the base address register can be summed to generate subsequent addresses for ROM access.

BRIEF DESCRIPTION OF THE FIGURES

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate at least one embodiment and are not intended to limit the scope thereof.

Figure 3:
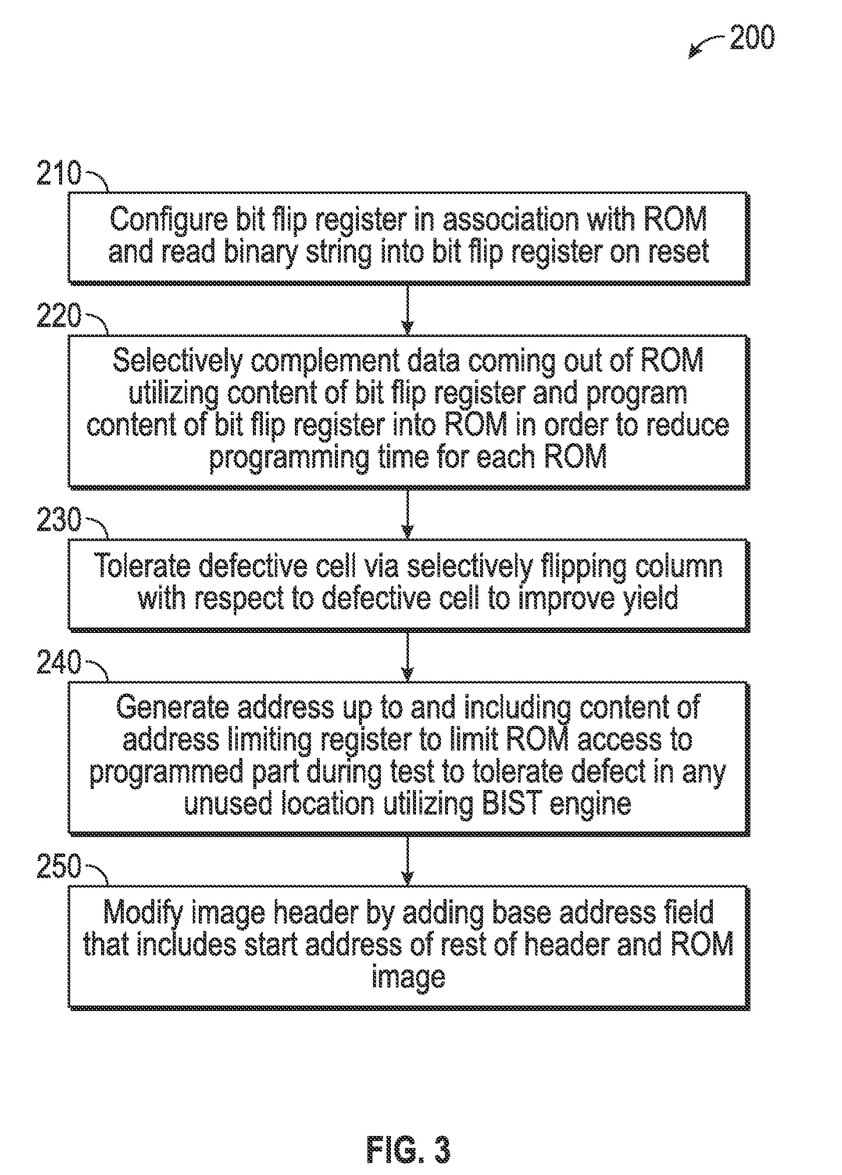
FIG. 3 illustrates a high level flow chart of operations illustrating logical operational steps of a method for improving ROM yield and programming time utilizing data transformation, in accordance with the disclosed embodiments.

FIG. 3 illustrates a high level flow chart of operations illustrating logical operational steps of a method 200 for improving ROM yield and programming time utilizing data transformation, in accordance with the disclosed embodiments. Note that in FIGS. 3-13, identical or similar blocks are generally indicated by identical reference numerals. In general, read only memory (ROM) devices are typically used to configure and test integrated circuit devices such as microprocessors, and to test and configure memory cache. Fuse arrays are utilized in ROM devices to store information.

A bit flip register 315 can be configured in association with a ROM 310 so that a binary string can be read into the bit flip register 315 on reset, as shown at block 210. The bit flip register 315 performs logical negation to a single bit, or each of several bits, switching state 0 to 1, and vice versa. Subsequently, data exiting the ROM 310 (DATA_INT) can be selectively complemented utilizing a content of the bit flip register 315 and the content of the bit flip register 315 can be programmed into the ROM 310 in order to reduce programming time for each ROM 310, as mentioned at block 220. A defective cell can be tolerated by selectively flipping a column with respect to the defective cell to improve yield, as described at block 230.

Figure 4:
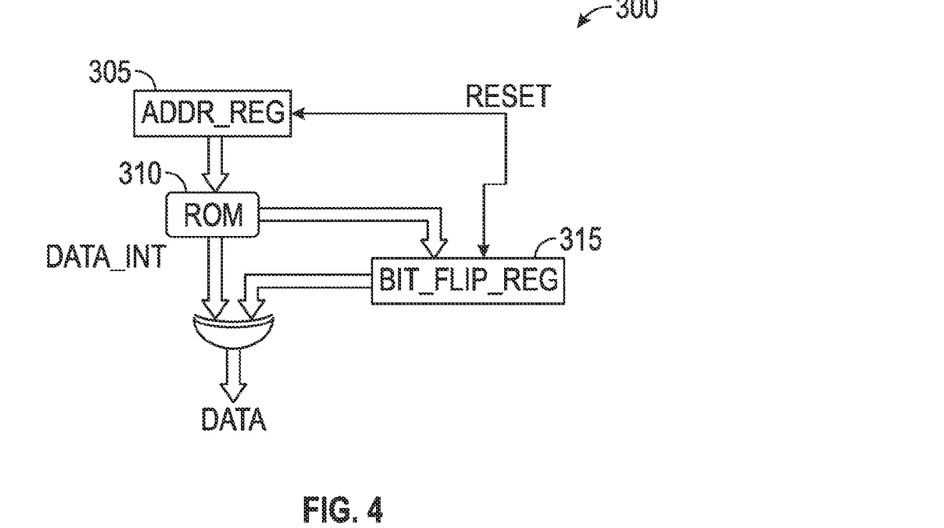
FIG. 4 illustrates a block diagram of a ROM programming system associated with a bit flip register, in accordance with the disclosed embodiments.

FIG. 4 illustrates a block diagram of a ROM programming system 300 associated with the bit flip register 315, in accordance with the disclosed embodiments. The ROM programming system 300 generally includes an address register 305, the ROM 310, and the bit flip register 315. The bit flip register 315 can be configured in association with the ROM 310 so that the binary string can be read into the bit flip register 300 on reset. Subsequently, data exiting the ROM (DATA_INT) 310 can be selectively complemented utilizing the content of the bit flip register 300 and the content of the bit flip register 300 can be programmed into the ROM 310 in order to reduce programming time for each ROM 300.

Figure 5:
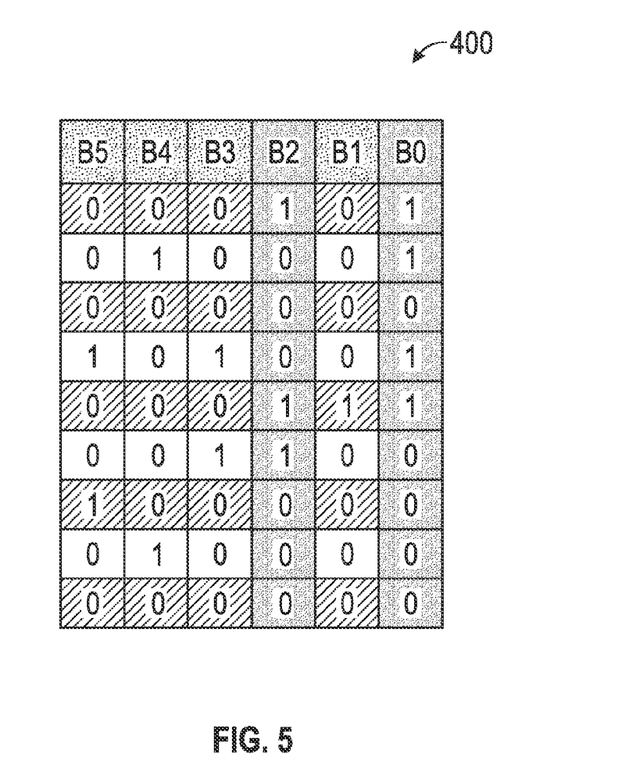
FIG. 5 illustrates an 8*6 bit ROM image depicting selective column bit flipping, in accordance with the disclosed embodiments.

FIG. 5 illustrates an 8*6 bit ROM image 400 depicting selective column bit flipping, in accordance with the disclosed embodiments. For example, if bit j of the register is 1, then DATA[j]=~DATA_INT[j]. Since, the content of the bit flip register 315 can be programmed into the ROM 310, this can change from one the to the next, for example, as shown in FIG. 5. Column B0, B2 bits are flipped whereas bits in the rest of the columns are not flipped.

Figure 6:
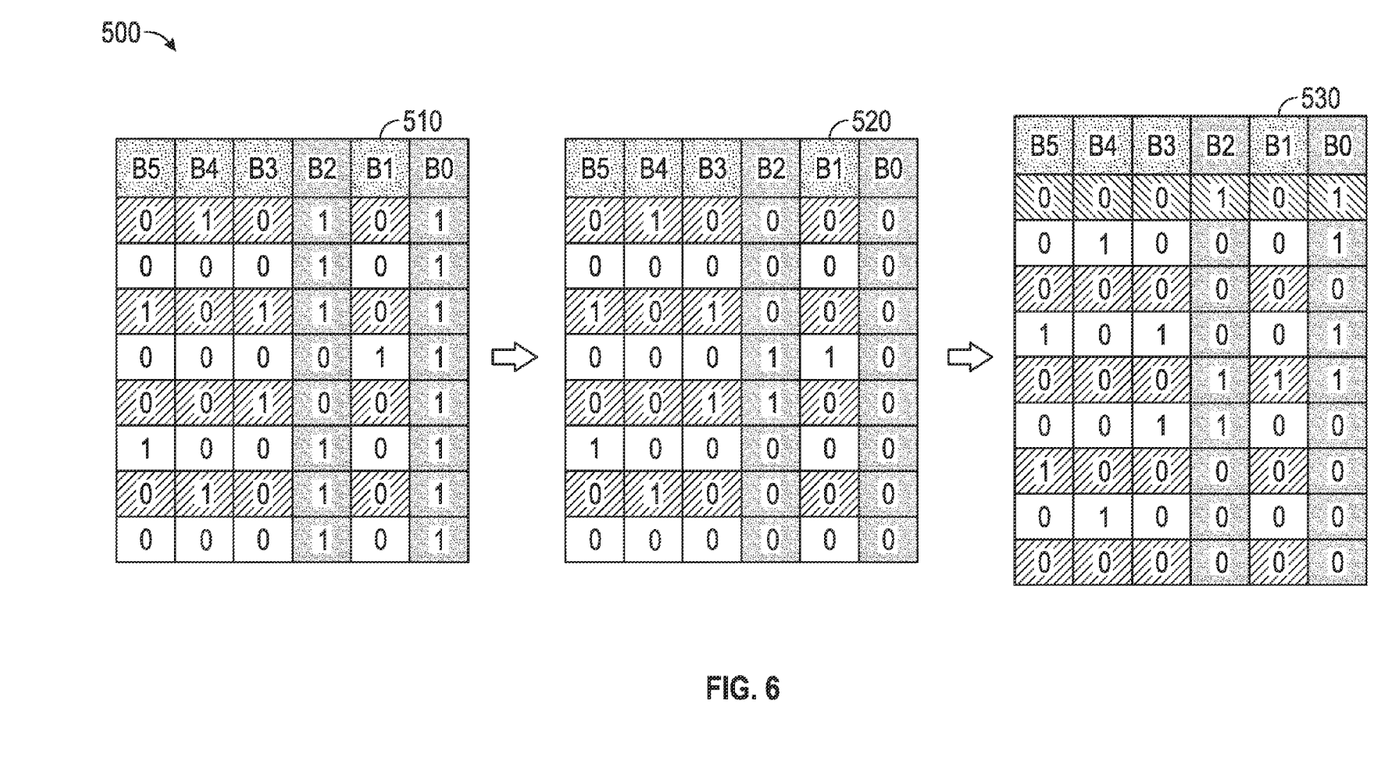
FIG. 6 illustrates an 8*6 bit ROM image depicting selective column bit flipping to reduce programming time, in accordance with the disclosed embodiments.

FIG. 6 illustrates an 8*6 bit ROM image 500 depicting selective column bit flipping to reduce programming time, in accordance with the disclosed embodiments. For example, in order to store ROM image 510 as shown in FIG. 6, 21 1 s have to be programmed. However, columns B2, B0 has more 1 s than 0 s. The bit flip register 315 flip bits in columns B0, B2 in order to obtain the ROM image 520. So 9 bits have to be programmed. The selective column bit flipping can be employed to obtain ROM image 530 in order to program 11 bits. Thus, the programming time can be saved for each ROM from programming 21 bits to 11 bits.

Figure 7:
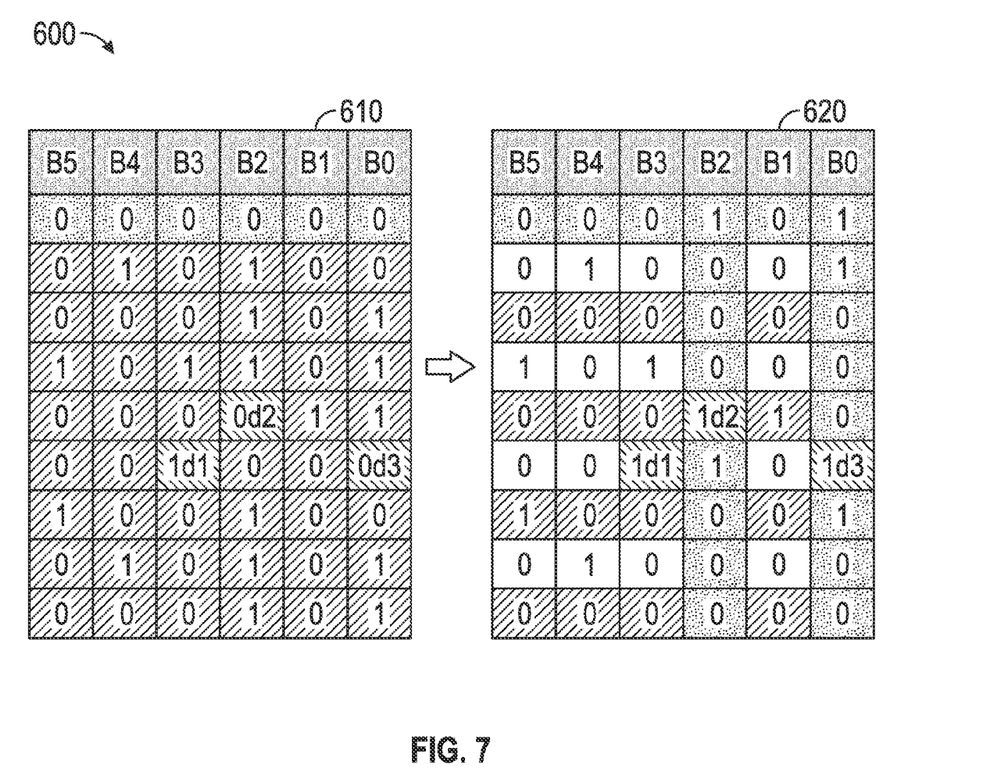
FIG. 7 illustrates an 8*6 bit ROM image depicting selective column bit flipping with respect to a defective cell, in accordance with the disclosed embodiments.

FIG. 7 illustrates an 8*6 bit ROM image 600 depicting selective column bit flipping with respect to a defective cell, in accordance with the disclosed embodiments. In FIG. 7, the user intends to store ROM image 610 and location 0 can be the bit flip register 315 entry. However, there are three defective cells, d1, d2, and d3 and they are programmed to 1 and cannot be changed to 0. Since d1 requires a 1 to tolerate this defect, the bits in column B2, B3 can be flipped for d2, d3 in order to tolerate the defect. The final ROM image 620 utilizing the selective column bit flipping is shown in FIG. 7. Note that in all the defective cells, in the final ROM Image 620, 1 is to be stored.

Figure 8:
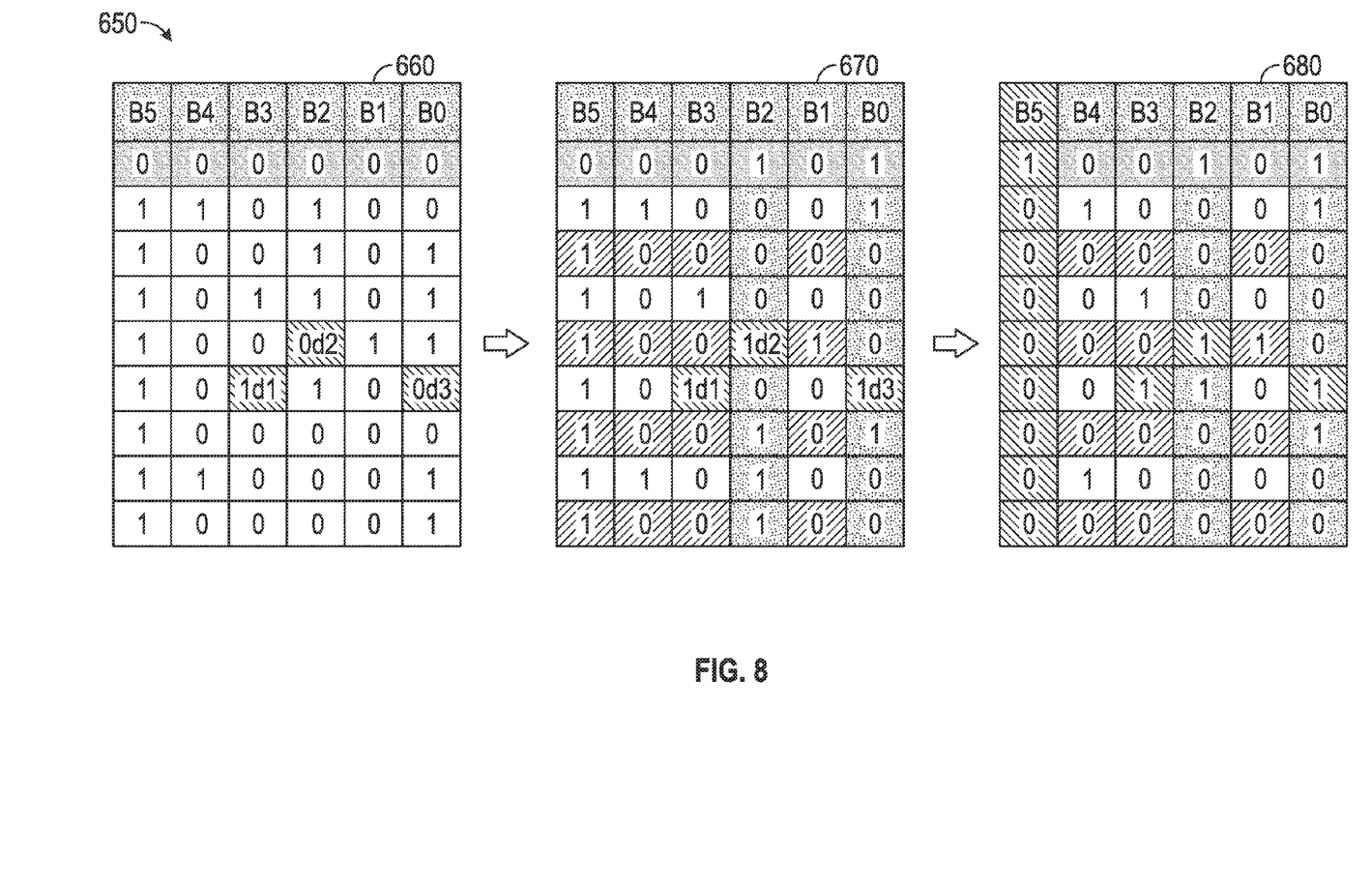
FIG. 8 illustrates an 8*6 bit ROM image depicting selective column bit flipping to reduce programming time and improve ROM yield, in accordance with the disclosed embodiments.

FIG. 8 illustrates an 8*6 bit ROM image 650 depicting selective column bit flipping to reduce programming time and improve ROM yield, in accordance with the disclosed embodiments. The data transformation can also be utilized to simultaneously reduce programming time and improve yield. First, the bits can be flipped to cover the defects. Then the bits can be flipped to reduce the programming time with the following restriction. If the column has been flipped to tolerate the defect, then it cannot be flipped to reduce test time. ROM image 670 illustrates bit flips to tolerate defects d1, d2, d3. Similarly, 18 bits have to be programmed to 1. However, by flipping the column, the image 680 can be obtained so that 12 bits have to be programmed.

Figure 9:
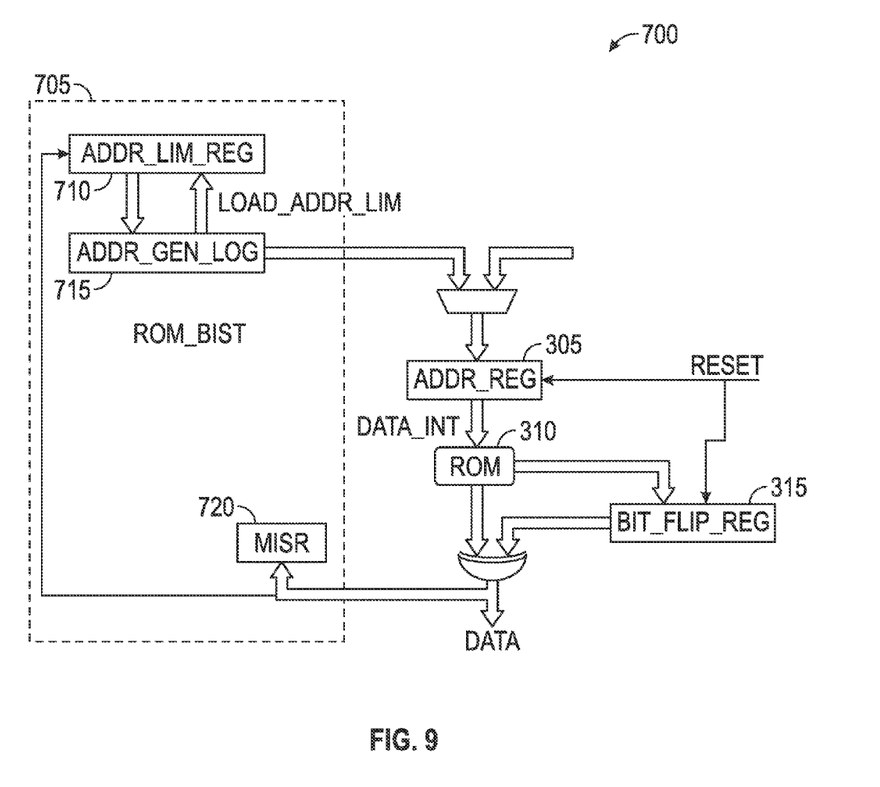
FIG. 9 illustrates a block diagram of a ROM programming system associated with a BIST engine to limit ROM access to a programmed part during test, in accordance with the disclosed embodiments.

A ROM BIST engine 705 that generates addresses up to and including content of an address limiting register 710 can be employed to limit the ROM access to a programmed part during test in order to tolerate defect in any unused location, as indicated at block 240. In general, the built-in self-test (BIST) is a mechanism that permits a machine to test itself. The main purpose of BIST is to reduce the complexity, and thereby decrease the cost and reduce reliance upon external (pattern-programmed) test equipment. BIST reduces test-cycle duration and the complexity of the test/probe setup by reducing the number of I/O signals that must be driven/examined under tester control which lead to a reduction in hourly charges for automated test equipment (ATE) service.

Figure 10:
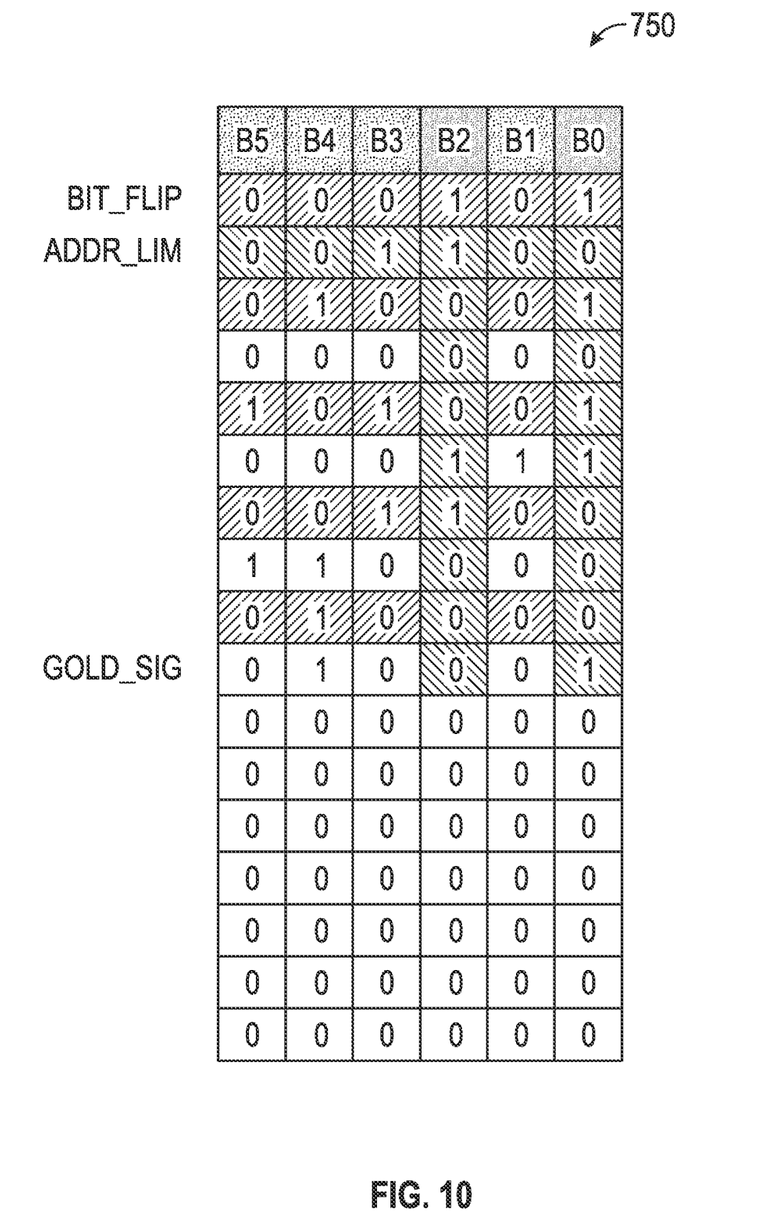
FIG. 10 illustrates a ROM image to limit ROM access during test, in accordance with the disclosed embodiments.

FIG. 9 illustrates a block diagram a ROM programming system 700 associated with the BIST engine 705 to limit ROM access to a programmed part during test, an accordance with the disclosed embodiments. In the functional mode, only the programmed part of the ROM 310 can be accessed. A mechanism to limit the ROM 310 access can be provided to the programmed part during test. In the example ROM image 750, the image shown in words 2 onwards is to be programmed such as word 0 contains column bit flip information. The header portion of the ROM image 750 can be extended in order to include ADDR_LIM in word 1. This points to the last word of the ROM 310 that has been utilized. In this example, it address is 01001. By flipping bit positions 2, 0 then 01100 can be obtained which can be the content of word 1. This information can be utilized by ROM_BIST 705, shown in the FIG. 9. On reset, the bit flip register 315 can be loaded with the content of location 0. During the BIST run, the ADDR_GEN_LOG 715 accesses location 1 and loads it into the ADDR_LIM_REG 710.

The BIST engine 705 generates the address and reads out the content of the ROM 310. The output of the ROM 310 can be compressed into the MISR 720. In existing ROM_BIST, the address generator generates the entire address sequence and reads the content of all the word locations. In the modified ROM_BIST 705 engine, the address generator 715 generates addresses up to and including the content of ADDR_LIM_REG 710. The content of the ROM 310 can be compressed in the MISR 720. At the end of the run, the signature stored in the MISR 720 can be compared with the GOLD_SIG of FIG. 10 which can be stored in the last utilized location of the ROM 310.

Figure 11:
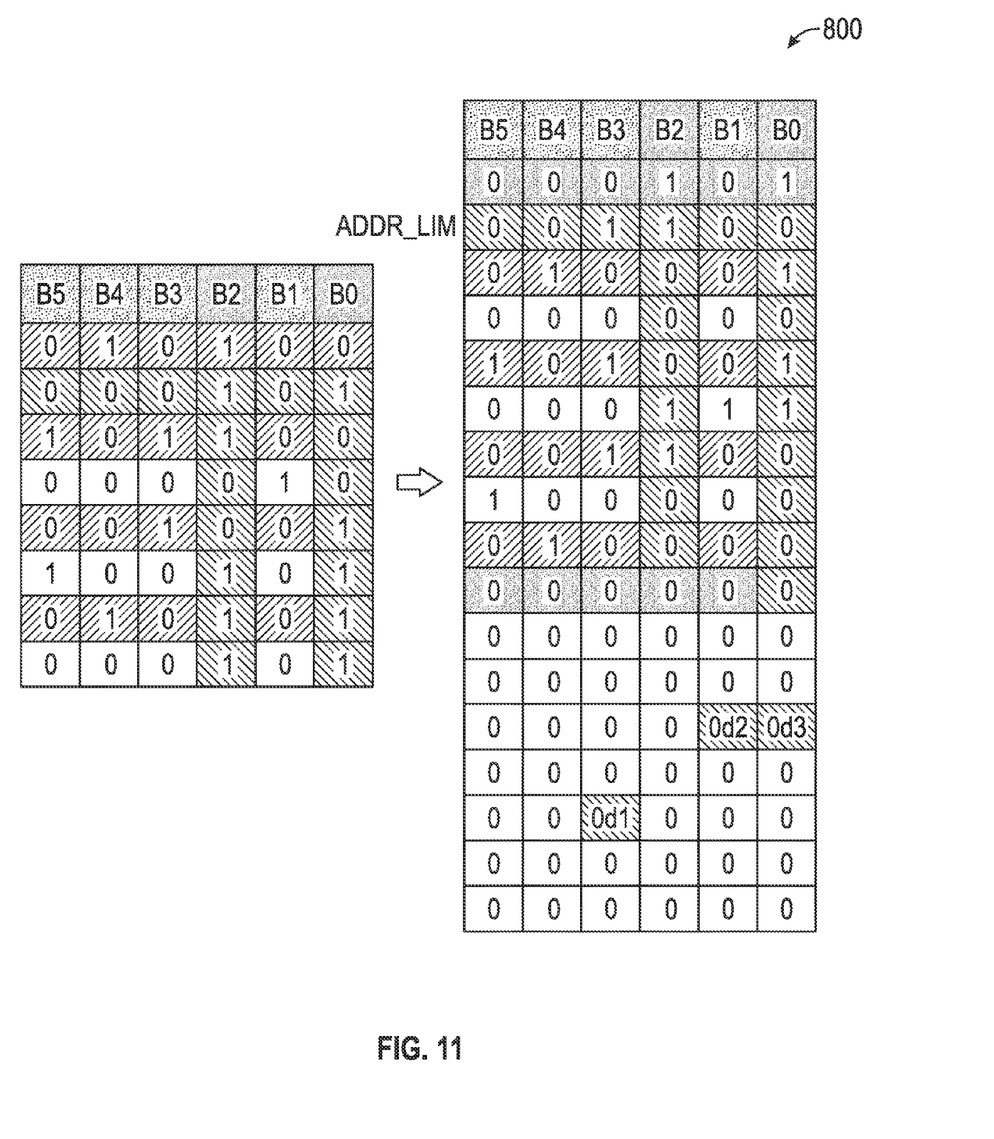
FIG. 11 illustrates another ROM image to limit ROM access during test, in accordance with the disclosed embodiments.

FIG. 11 illustrates the ROM image 800 to limit ROM access during test, in accordance with the disclosed embodiments. By limiting the access of the ROM 310 only within the region where it has been programmed, the ROM_BIST engine 705 never accesses the defective cells shown in FIG. 11 and the test will pass such as this supports for ROM yield improvement. This scheme can tolerate any defect in any of the unused location.

Figure 12:
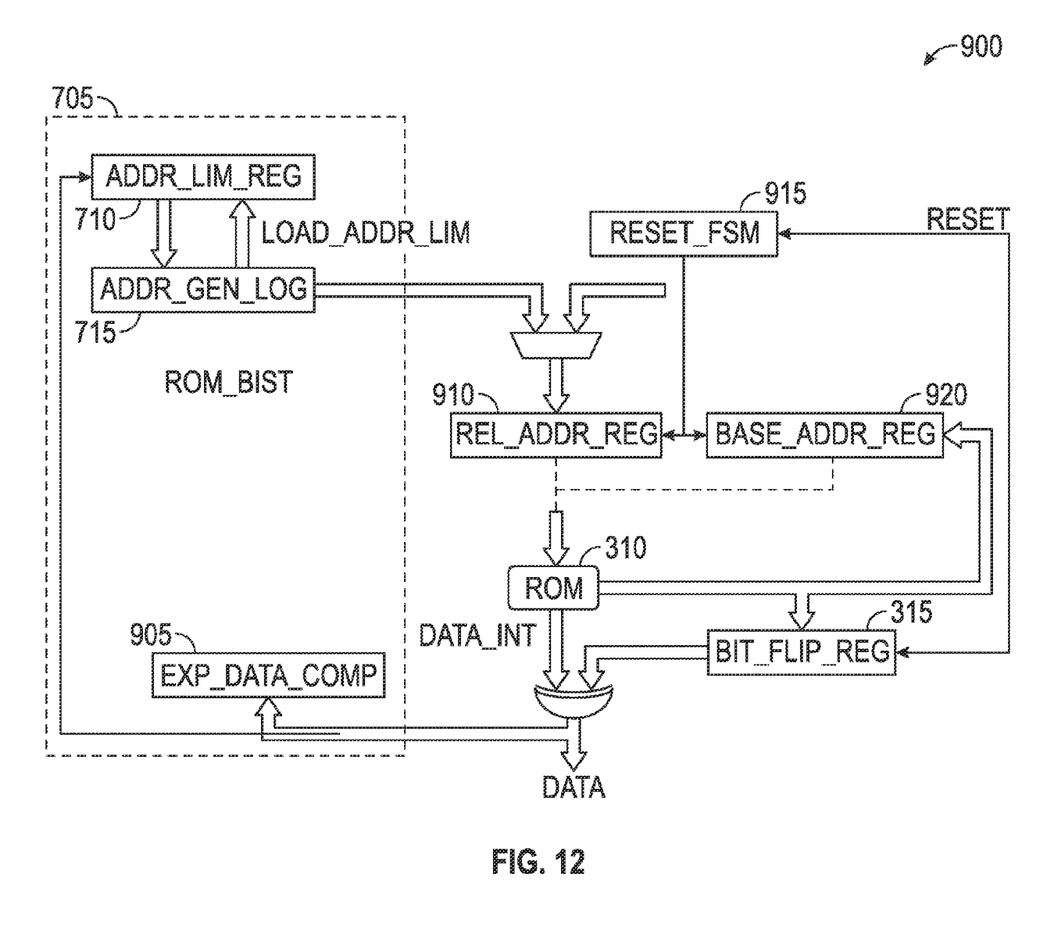
FIG. 12 illustrates a block diagram of a ROM programming system associated with a floating ROM, in accordance with the disclosed embodiments.
Figure 13:
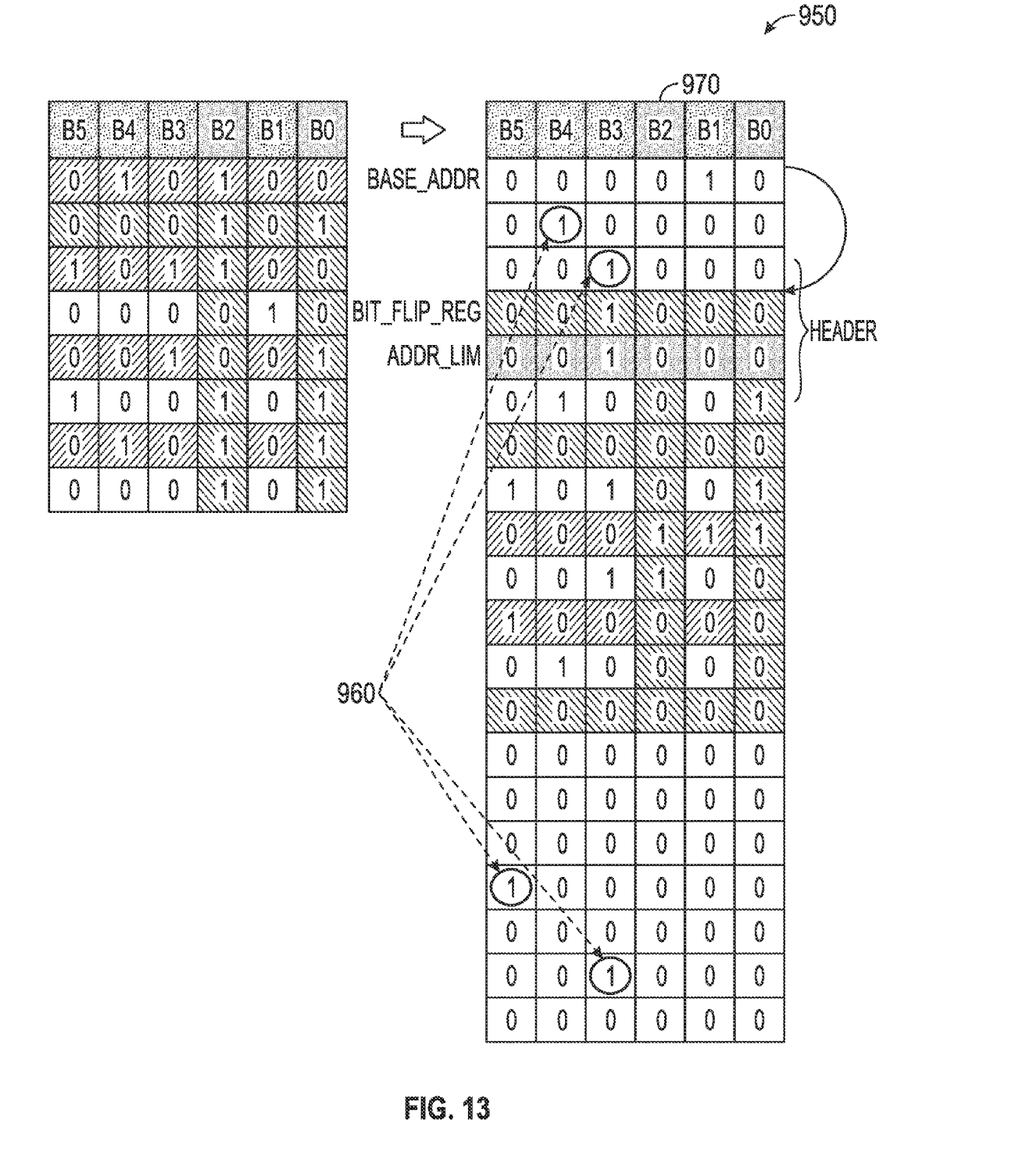
FIG. 13 illustrates a floating ROM image, in accordance with the disclosed embodiments.

An image header can be modified by adding a base address field 920 that includes a start address of the rest of the header and the ROM image, as depicted at block 250. FIG. 12 illustrates a block diagram a ROM programming system 900 with respect to a floating ROM image, in accordance with the disclosed embodiments. The image header can be modified by adding the extra field (base address) 920 that contains the start address of the rest of the header and the ROM image. The BASE_BASE address can be stored in word 0. An example image is shown in FIG. 13. The circuitry to access and test the ROM 310 is illustrated in FIG. 12. A RESET_FSM 915 clears the REL_ADDR_REG 910 and loads the base address 920 bits and bit flip register 315 bits, respectively, into the base address register 920 and the bit flip register 315. Subsequent addresses generated for the ROM 310 access can be the sum of REL_ADDR_REG 910 and base address register 920.

FIG. 13 illustrates the floating ROM image 950, in accordance with the disclosed embodiments. The ROM image 970 illustrates selective column bit flipping with respect to defective cells 960, selective column bit flipping to reduce programming time and the base address field that includes a start address of the rest of the header and the ROM image. The ROM programming system 300, 700, and 900 transforms the original data to be programmed into the ROM 310 to reduce ROM programming time and increase the ROM yield.

Based on the foregoing, it can be appreciated that a number of embodiments, preferred and alternative, are disclosed herein. For example, in one embodiment a method of generating data transformations to improve ROM yield and programming time can be implemented. Such a method can include, for example, the steps or logical operations of configuring a bit flip register in association with a ROM and thereafter reading a binary string into the bit flip register upon reset; selectively complementing data output from the ROM utilizing a content of the bit flip register and programming the content of the bit flip register into the ROM in order to reduce a programming time with respect to each ROM; tolerating a defective cell by selectively flipping a column with respect to a defective cell to improve a yield with respect to the ROM; and limiting the ROM access to a programmed part during a test in order to tolerate a defect in an unused location utilizing a ROM built-in self test engine that generates addresses up to and including a content of an address limiting register.

In another embodiment, a step or logical operation can be provided for modifying an image header by adding a base address field that includes a start address of rest of a header and a ROM image to simultaneously reduce the ROM programming time and increase the ROM yield. In yet another embodiment, a step or logical operation can be provided for flipping the bits to cover the defect and thereafter flip a remaining selective bit to reduce the ROM programming time. In still another embodiment, a step or logical operation can be implemented for accessing a programmed part of the ROM in a functional mode and limiting the ROM access to the programmed part during test.

In yet other embodiments, steps or logical operations can be provided for generating an address up to and including the content of the address limiting register utilizing an address generator with respect to the ROM built-in self test engine; and compressing an output of the ROM into a multiple-input signature register.

In other embodiments, steps or logical operations can be implemented for comparing a signature stored in the multiple-input signature register with a gold signature which is stored in a last utilized location of the ROM at end of the run; and limiting access of the ROM only within a region where the ROM is programmed so that the ROM built-in self test engine never accesses the defective cell.

In another embodiment, steps or logical operations can be provided for clearing an REL address register and loading a base address bit and the bit flip register bit, respectively, into the base address register and the bit flip register; and summing the REL address register and the base address register to obtain subsequent addresses generated for the ROM access.

In another embodiment, a system of generating data transformations to improve ROM yield and programming time can be implemented. Such a system can include, for example, a processor; and a computer-usable medium embodying computer program code, the computer-usable medium capable of communicating with the processor. The computer program code can include instructions executable by the processor and configured for: providing a bit flip register in association with a ROM and thereafter reading a binary string into the bit flip register upon reset; selectively complementing data output from the ROM utilizing a content of the bit flip register and programming the content of the bit flip register into the ROM in order to reduce a programming time with respect to each ROM; tolerating a defective cell by selectively flipping a column with respect to a defective cell to improve a yield with respect to the ROM; and limiting the ROM access to a programmed part during a test in order to tolerate a defect in an unused location utilizing a ROM built-in self test engine that generates addresses up to and including a content of an address limiting register.

In another embodiment, such instructions can be further configured for modifying an image header by adding a base address field that includes a start address of rest of a header and a ROM image to simultaneously reduce the ROM programming time and increase the ROM yield. In yet another embodiment, such instructions can be further configured for flipping the bits to cover the defect and thereafter flip a remaining selective bit to reduce the ROM programming time.

In another embodiment, such instructions can be further configured for accessing a programmed portion of the ROM in a functional mode and limiting the ROM access to the programmed portion during a test. In yet another embodiment, such instructions can be further configured for generating an address up to and including the content of the address limiting register utilizing an address generator with respect to the ROM built-in self test engine; and compressing an output of the ROM into a multiple-input signature register.

In other embodiments, such instructions can be further configured for comparing a signature stored in the multiple-input signature register with a gold signature which is stored in a last utilized location of the ROM at end of the run and limiting access of the ROM only within a region where the ROM is programmed so that the ROM built-in self test engine never accesses the defective cell.

In yet other embodiments, such instructions can be further configured for clearing an REL address register and loading a base address bit and the bit flip register bit, respectively, into the base address register and the bit flip register; and summing the REL address register and the base address register to obtain subsequent addresses generated for the ROM access.

In another embodiment, a processor-readable medium storing code representing instructions to cause a process for generating data transformations to improve ROM yield and programming time can be implemented. Such code can include code to, for example: configure a bit flip register in association with a ROM and thereafter reading a binary string into the bit flip register upon reset; selectively complement data output from the ROM utilizing a content of the bit flip register and program the content of the bit flip register into the ROM in order to reduce a programming time with respect to each ROM; tolerate a defective cell by selectively flipping a column with respect to a defective cell to improve a yield with respect to the ROM; and limit the ROM access to a programmed part during a test in order to tolerate a defect in an unused location utilizing a ROM built-in self test engine that generates addresses up to and including a content of an address limiting register.

In another embodiment, such code can further include code to modify an image header by adding a base address field that includes a start address of rest of a header and a ROM image to simultaneously reduce the ROM programming time and increase the ROM yield. In yet another embodiment, such code can further include code to flip the bits to cover the defect and thereafter flip a remaining selective bit to reduce the ROM programming time. In other embodiments, such code can further include code to access a programmed portion of the ROM in a functional mode and limit the ROM access to the programmed portion during a test.

In another embodiment, such code can further include code to generate an address up to and including the content of the address limiting register utilizing an address generator with respect to the ROM built-in self test engine; and compress an output of the ROM into a multiple-input signature register.

In still another embodiment, such code can further include code to compare signature stored in the multiple-input signature register with a gold signature which is stored in a last utilized location of the ROM at end of the run and limit access of the ROM only within a region where the ROM is programmed so that the ROM built-in self test engine never accesses the defective cell.

In yet another embodiment, such code can further include code to clear an REL address register and loading a base address bit and the bit flip register bit, respectively, into the base address register and the bit flip register; and sum the REL address register and the base address register to obtain subsequent addresses generated for the ROM access.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

The invention claimed is:

1. A method of generating data transformations to improve ROM yield and programming time, said method comprising:
configuring a bit flip register in association with a ROM and thereafter reading a binary string into said it flip register upon reset;
selectively complementing data output from said ROM utilizing a content of said bit flip register and programming said content of said bit flip register into said ROM in order to reduce a programming time with respect to each ROM;
tolerating a defective cell by selectively flipping a column with respect to a defective cell to improve a yield with respect to said ROM; and
limiting said ROM access to a programmed part during a test run in order to tolerate a defect in an unused location utilizing a ROM built-in self test engine that generates addresses up to and including a content of an address limiting register.

2. The method of claim 1 further comprising modifying an image header by adding a base address field that includes a start address of a remaining portion of a header and a read-only memory (ROM) image to simultaneously reduce said ROM programming time and increase said ROM yield.

3. The method of claim 1 further comprising flipping said bits to cover said defect and thereafter flip a remaining selective bit to reduce said ROM programming time.

4. The method of claim 1 further comprising accessing a programmed part of said ROM in a functional mode and limiting said ROM access to said programmed part during said test run.

5. The method of claim 1 further comprising:
generating an address up to and including said content of said address limiting register utilizing an address generator with respect to said ROM built-in self test engine; and
compressing an output of said ROM into a multiple-input signature register.

6. The method of claim 5 further comprising:
comparing a signature stored in said multiple-input signature register with a gold signature which is stored in a last utilized location of said ROM at an end of said test run; and
limiting access of said ROM only within a region where said ROM is programmed so that said ROM built-in self test engine never accesses said defective cell.

7. The method of claim 1 further comprising:
clearing an REL address register and loading a base address bit and a bit flip register bit, respectively, into said base address register and said bit flip register; and
summing said REL address register and said base address register to obtain subsequent addresses generated for said ROM access.

8. A system of generating data transformations to improve ROM yield and programming time, said system comprising:
a processor; and
a computer-usable medium embodying computer program code, said computer-usable medium capable of communicating with the processor, said computer program code comprising instructions executable by said processor and configured for:
configuring a bit flip register in association with a ROM and thereafter reading a binary string into said bit flip register upon reset;
selectively complementing data output from said ROM utilizing a content of said bit flip register and programming said content of said bit flip register into said ROM in order to reduce a programming time with respect to each ROM;
tolerating a defective cell by selectively flipping a column with respect to a defective cell to improve a yield with respect to said ROM; and
limiting said ROM access to a programmed part during a test run in order to tolerate a defect in an unused location utilizing a ROM built-in self test engine that generates addresses up to and including a content of an address limiting register.

9. The system of claim 8 wherein said instructions are further configured for modifying an image header by adding a base address field that includes a start address of a remaining portion of a header and a ROM image to simultaneously reduce said ROM programming time and increase said ROM yield.

10. The system of claim 8 wherein said instructions are further configured for flipping said bits to cover said defect and thereafter flip a remaining selective bit to reduce said ROM programming time.

11. The system of claim 8 wherein said instructions are further configured for:
accessing a programmed portion of said ROM in a functional mode; and
limiting said ROM access to said programmed portion during said test run.

12. The system of claim 8 wherein said instructions are further configured for:
generating an address up to and including said content of said address limiting register utilizing an address generator with respect to said ROM built-in self test engine; and
compressing an output of said ROM into a multiple-input signature register.

13. The system of claim 12 wherein said instructions are further configured for:
comparing signature stored in said multiple-input signature register with a gold signature which is stored in a last utilized location of said ROM at an end of said test run; and
limiting access of said ROM only within a region where said ROM is programmed so that said ROM built-in self test engine never accesses said defective cell.

14. The system of claim 8 wherein said instructions are further configured for:
clearing a REL address register and loading a base address bit and a bit flip register bit, respectively, into said base address register and said bit flip register; and
summing REL address register and said base address register to obtain subsequent addresses generated for said ROM access.

15. A processor-readable medium storing code representing instructions to cause a process for generating data transformations to improve ROM yield and programming time, said code comprising code to:
configure a bit flip register in association with a ROM and thereafter reading a binary string into said Pit flip register upon reset;
selectively complement data output from said ROM utilizing a content of said bit flip register and program said content of said bit flip register into said ROM in order to reduce a programming time with respect to each ROM;
tolerate a defective cell by selectively flipping a column with respect to a defective cell to improve a yield with respect to said ROM; and
limit said ROM access to a programmed part during a test run in order to tolerate a defect in an unused location utilizing a ROM built-in self test engine that generates addresses up to and including a content of an address limiting register.

16. The processor-readable medium of claim 15 wherein said code further includes code to modify an image header by adding a base address field that includes a start address of a remaining portion of a header and a ROM image to simultaneously reduce said ROM programming time and increase said ROM yield.

17. The processor-readable medium of claim 15 wherein said code further includes code to flip said bits to cover said defect and thereafter flip a remaining selective bit to reduce said ROM programming time.

18. The processor-readable medium of claim 15 wherein said code further includes code to:
access a programmed portion of said ROM in a functional mode; and
limit said ROM access to said programmed portion during said test run.

19. The processor-readable medium of claim 15 wherein said code further includes code to:
generate an address up to and including said content of said address limiting register utilizing an address generator with respect to said ROM built-in self test engine; and
compress an output of said ROM into a multiple-input signature register.

20. The processor-readable medium of claim 19 wherein said code further includes code to:
compare signature stored in said multiple-input signature register with a gold signature which is stored in a last utilized location of said ROM at end of said test run; and
limit access of said ROM only within a region where said ROM is programmed so that said ROM built-in self test engine never accesses said defective cell.

* * * * *